United States Patent [19]

Fletcher et al.

[11] 3,889,122

[45] June 10, 1975

[54] METHOD OF DETERMINING BOND QUALITY OF POWER TRANSISTORS ATTACHED TO SUBSTRATES

[76] Inventors: James C. Fletcher, Administrator of the National Aeronautics and Space Administration with respect to an invention of; Thomas A. Telfer, Clinton, N.Y.

[22] Filed: Apr. 26, 1974

[21] Appl. No.: 464,721

[52] U.S. Cl. .................. 250/359; 250/460; 250/492
[51] Int. Cl. .................. G01t 1/16
[58] Field of Search ........... 250/358, 302, 304, 460, 250/359, 492

[56] References Cited

UNITED STATES PATENTS

| | | | |
|---|---|---|---|
| 2,097,760 | 11/1937 | Failla | 250/359 |
| 2,582,774 | 1/1952 | Fua | 250/358 |
| 2,583,132 | 1/1952 | Altar et al. | 250/358 |

OTHER PUBLICATIONS

"Non–Destructive Testing" by Collins, Electronics World, Vol. 75, No. 2, Feb. 1966, pp. 33–36.

Autoray Automatic Radiographic Inspection Equipment Machinery & Production Engineering Vol. 121, No. 130 Nov. 1972.

*Primary Examiner*—Harold A. Dixon
*Attorney, Agent, or Firm*—George J. Porter; L. D. Wofford, Jr.; John R. Manning

[57] ABSTRACT

A method of determining the quality of the bond between a power transistor and an electrically insulative, heat conductive substrate includes taking X-ray exposures of the bond. In the exposures, the areas where the bond quality is poor show up as dark spots in relation to a lighter background area where the bond quality is good. The exposures are tested in a light meter device in which the average transparency of an exposure indicates the percentage of voids, or poorly bonded areas. Only those units having less than a predetermined percentage of voids are acceptable.

6 Claims, 5 Drawing Figures

METHOD OF DETERMINING BOND QUALITY OF POWER TRANSISTORS ATTACHED TO SUBSTRATES

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

The present invention relates generally to the testing of the area of bond between two work pieces, and more specifically to determining the quality of the bond between a power transistor and its insulator substrate.

Attachment of power transistor chip devices to a heat sink is a critical operation. A complete bond between the chip and its substrate, void free, and with uniform wetting of the back of the chip, is required for the power transistor to handle maximum power. In practice, a perfect bond is rarely achieved in mass production operations and, as a result, power handling specifications for power transistors are set at some less than optimum level. A certain, less than perfect, quality of bonding between the chip and its substrate is required in order for the transistor to meet specifications. Unfortunately, the quality of the bond cannot be determined by visual examination. This has led to the development of various methods of checking the quality of the bond.

One such method is commonly known as the "zing test" and consists of striking the chip in the center with a centerpunch. Another method involves remelting the bond and removing the chip from the substrate for examination. Still another method involves the application of electrical power bursts to the chip. The disadvantages of these methods are evident. The first two tests are destructive and thus cannot be used for in-process individual bond checking during production operations except to check an occasional unit to detect general processing errors. The electrical power burst method may be destructive and has the grave disadvantage that it can only be performed after the power transistor chip has been wired.

SUMMARY OF THE INVENTION

In accordance with the present invention, a method of checking the quality of the bond between the power transistor chip and the substrate is provided which has none of the above-noted disadvantages of the prior art methods. To achieve this, the bond is illuminated by X-rays and an X-ray exposure of the bond is taken. It has been found that areas where the bond quality is good are relatively opaque to the X-rays while areas where the bond quality is poor are relatively transparent to the X-rays. Thus, on the X-ray exposure, the areas of poor bond quality, known as, and hereinafter referred to as, voids, show up as dark spots on a light background. The percentage of the bond area which is comprised of voids is determined by examining the exposure with a light meter device. Those units having a predetermined percentage of voids are rejected. For high accuracy, the X-ray machine settings should be the same for the X-ray exposures of all the units in a particular run, or of a particular kind, and the light meter device must be calibrated on the basis of empirically obtained data.

Therefore, it is an object of the present invention to provide an accurate, non-destructuve method of determining the quality of power transistor chip-substrate bonds.

It is another object of the present invention to provide a method of testing bond quality which can conveniently be used in-process.

It is a further object of the present invention to provide an in-process, non-destructive method of checking the bond quality of each individual power transistor unit during a production run.

BRIEF DESCRIPTION OF THE DRAWINGS

These and other objects, advantages, and novel features of the present invention will become apparent from the following detailed description of the invention when considered in conjunction with the accompanying drawings, in which like reference numerals designate like parts throughout the figures thereof, and wherein.

DESCRIPTION OF THE PREFERRED EMBODIMENTS

Figure 1:
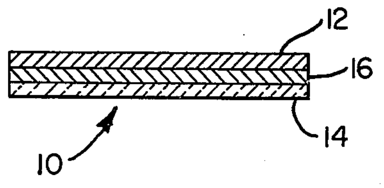
FIG. 1 shows a power transistor unit before bonding.

Referring now to FIG. 1, a typical power transistor chip unit 10 comprises the semiconductor chip 12, which is typically silicon or germanium, and substrate 14 of a material such as beryllium oxide, which is an electrical insulator and also a good heat conductor. Between the chip and the substrate is a thin film of bonding material 16, which is metal, such as a gold alloy which has a low melting point. The gold alloy may be in the form of a thin sheet, or preform, and can be a gold-semi conductor alloy, or the substrate may be metallized. The unit 10 is subjected to heat in the conventional manner to cause the layer 16 to melt and to bond the chip 12 to substrate 14.

Figure 2:
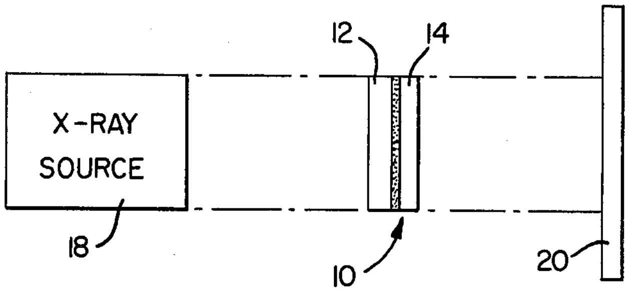
FIG. 2 illustrates the X-raying of the bond.
Figure 3:
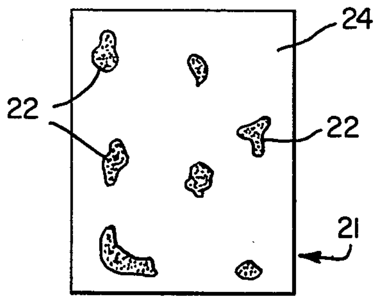
FIG. 3 illustrates the appearance of a typical X-ray exposure of a bond.

Referring now to FIG. 2, the unit 10, having been bonded, is placed in an X-ray machine where a source of X-rays 18 sends X-rays through unit 10 to expose X-ray film 20. The X-rays strike the surface of chip 12 perpendicular thereto and then pass through the bond and substrate 14. As has been described above, bonding voids are more transparent to the X-rays than the bonded areas and thus show up on the X-ray exposure in the manner illustrated in FIG. 3. There, the negative 21 of the exposure of a typical bond shows voids 22 as dark areas in a lighter background 24, which represents the area of good quality bonding. Obviously, in the positive, the light and dark areas of the image are reversed.

Figure 5:
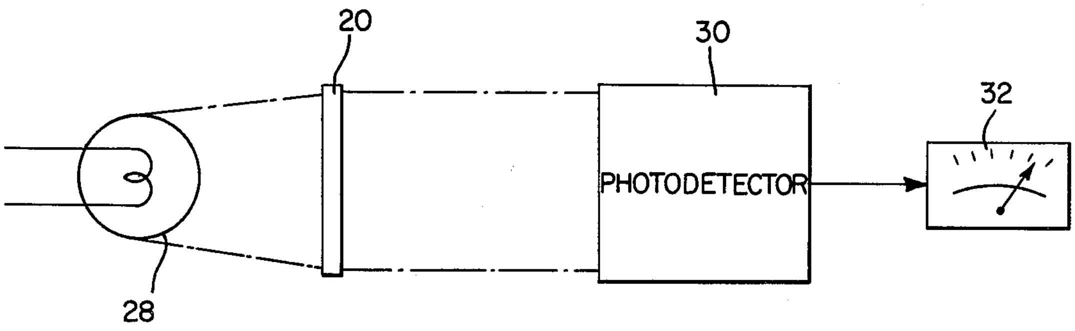
FIG. 5 illustrates the reading of the X-ray exposures by a light meter device.

Referring now to FIG. 5, the exposure (shown here as negative 20) is illuminated by light from light source 28. The light transmitted through exposure 20 is detected by photodetector 30 which provides an electrical signal corresponding to the intensity of the received light. Meter movement 32 provides a visual indication of the intensity of the transmitted light and, hence, the average density of the exposure 20. Since the average intensity of the transmitted light will vary with the percentage of voids, the reading on meter movement 32 provides a visual indication of the percentage of voids. In the industry it has been found empirically that void areas approaching 20% of the chip area can be tolerated if they are scattered. The light meter device provides a quantitative percentage measurement of the void area, obviating reliance on visual estimates.

To be used in-process to check individual units during production runs, certain data must be obtained empirically and used to calibrate the light meter device in order to have meaningful and accurate results. This data may be obtained in the following manner. X-ray exposures of some units already bonded are obtained. The X-ray machine settings must be the same for all these photographs. The percentage of voids for these units is then determined by some other method, such as remelt and removal. These X-ray exposures, with known percentages of voids, are then used to calibrate the light meter device in a conventional manner. During the ensuing production run, all photographs of the same type of unit are taken at the same X-ray machine settings.

X-rays will not always show a lack of bonding if the molten preform has conformed exactly in all areas to the bottom of the chip. It is possible to have an X-ray which shows no voids at all and still not have a good bond. Therefore, the process for bonding the power transistors should be arrived at by using the above-mentioned zing test, in which the center of the chip is struck with a pointed instrument to check for wetting, in addition to the X-ray method disclosured herein. The zing test is used only when the particular bonding process is being developed, not during production runs. Once it has been established that bonding is taking place and that the X-ray exposure gives a true ideal of the quality of the bonding, the zing test is abandoned.

Figure 4:
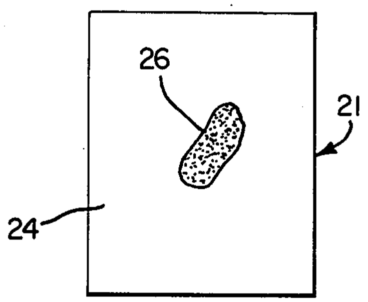
FIG. 4 illustrates the appearance of an X-ray exposure of a unit having a large void.

It has been found by the industry that the location of the voids, as well as the percentage, is a factor in the power handling capability of a particular unit. Thus, if all of the voids are concentrated in a small area, or if there is a very large void, such as void 26 in FIG. 4, the unit may not be up to specifications even if the void area is less than 20 percent. Because of this, a quick visual check of the X-ray photograph for large void areas is recommended in conjunction with the quantitative measurement provided by the light meter device.

Obviously, many modifications and variations of the present invention are possible in light of the above teachings. It is therefore to be understood that, within the scope of the appended claims, the invention may be practiced otherwise than as specifically described.

What is claimed is:

1. A method of determining the quality of the bond between a power transistor chip and a heat conductive, electrically insulating substrate between which is a thin layer of bonding material, the chip, substrate and material in combination constituting a unit, comprising:

a. selecting an index of bond quality for a production run unit in terms of the ratio that the area of bond voids in a minimally acceptable unit bears to the entire bond area;

b. X-raying the bond area of a production run unit to obtain an X-ray exposure transparency;

c. measuring the average optical density of the transparency; and d. comparing the measured average optical density of the transparency with the index to determine the bond quality of the production run unit relative to a minimally acceptable unit.

2. A method according to claim 1 wherein the index is selected by:

a. obtaining X-ray exposure transparencies of the bond areas of a number of test units;

b. measuring the average optical density of each transparency;

c. examining the bond of each test unit to determine its quality; and d. correlating the bond quality of each test unit with the average optical density of the transparency associated with the test unit to obtain the index of bond quality for production run units.

3. A method according to claim 2 wherein the X-ray transparencies are taken with the X-rays impinging on the outer surface of the chip perpendicular thereto.

4. A method according to claim 3 wherein the average optical density of a transparency is measured by placing the transparency between a light source and a light meter whose deflection is a measure of the average optical density.

5. A method according to claim 4 wherein all of the X-ray transparencies are taken under the same conditions.

6. A method according to claim 5 wherein the index is 20 percent so that a production run unit whose ratio of bond voids to the entire bond area exceeds the index is rejected.

* * * * *